(12) United States Patent
Cetinkaya et al.

(10) Patent No.: US 7,566,384 B2
(45) Date of Patent: Jul. 28, 2009

(54) SYSTEM AND APPARATUS FOR REAL-TIME MONITORING AND CONTROL OF SPUTTER TARGET EROSION

(75) Inventors: Cetin Cetinkaya, Potsdam, NY (US); Bjoern Pigur, Brooklyn, NY (US); Rajan Mathew, Nanuet, NY (US)

(73) Assignee: Praxair Technology, Inc., Danbury, CT (US)

(*) Notice: Subject to any disclaimer, the term of this patent is extended or adjusted under 35 U.S.C. 154(b) by 422 days.

(21) Appl. No.: 11/186,974

(22) Filed: Jul. 22, 2005

(65) Prior Publication Data

US 2007/0017800 A1 Jan. 25, 2007

(51) Int. Cl.
*C23C 14/34* (2006.01)
(52) U.S. Cl. .......................... 204/192.13; 204/298.03; 204/192.12
(58) Field of Classification Search ............ 204/192.12, 204/192.13, 298.03
See application file for complete search history.

(56) References Cited

U.S. PATENT DOCUMENTS

| | | | | |
|---|---|---|---|---|
| 6,811,657 | B2 | 11/2004 | Jaso .................. | 204/192.13 |
| 6,974,524 | B1 | 12/2005 | Jaso et al. ............ | 204/192.13 |

FOREIGN PATENT DOCUMENTS

| | | |
|---|---|---|
| DE | 216258 | 6/1983 |
| GB | 2 121 964 A * | 1/1984 |
| JP | 631998290270 | 11/1988 |
| JP | 6199441744 | 2/1994 |
| JP | 06-088231 * | 3/1994 |
| WO | 2004024979 | 3/2004 |

OTHER PUBLICATIONS

Welch, "The Use of Fast Fourier Transform for the Estimation of Power Spectra: A Method Based on Time Averaging Over Short, Modified Periodograms", IEEE Transactions on Audio Electroacoustics, 15 (1967) pp. 70-73.

Kodera et al., "Analysis of Time-Varying Signals with Small BT Values", IEEE Transactions on Acoustics, Speech, Signal Processing, 26 (1968) pp. 64-76.

Waits, "Planar Magnetron Sputtering", Journal of Vacuum Science Technology, 15(2) (1978) pp. 179-187.

Auger et al., "Improving the Readability of Time-Frequency and Time-Scale Representations by the Reassignment Method", IEEE Transactions on Signal Processing, 43 (1995) pp. 1068-1089.

Chimenti, "Guided Waves in Plates", Applied Mechanics Review, 50(5) (1997) pp. 247-285.

Rossnagel. "Sputtering Deposition for Semiconductor Manufacturing", IBM Journal Research and Development, (43) (1999) pp. 163-180.

(Continued)

*Primary Examiner*—Rodney G McDonald
(74) *Attorney, Agent, or Firm*—Iurie A. Schwartz

(57) ABSTRACT

The present invention relates to a method and apparatus for real-time monitoring and controlling surface area erosion of a sputter target assembly utilized in a physical vapor deposition process.

13 Claims, 13 Drawing Sheets

OTHER PUBLICATIONS

Kelly et al. "Magnetron Sputtering: A Review of Recent Developments and Applications", Vacuum 56(3) (2000) pp. 159-172.

Valle, "On Characterizing Multi-Mode, Dispersive Lamb Waves", Review of Progress in Quantitative Nondestructive Evaluation, 20B (2000) pp. 1047-1052.

Luangvilai, et al., "Guided Lamb Wave Propagation in Composition Plate/Concrete Component", Journal of Engineering Mechanics, 128(12) (2002) pp. 1337-1341.

Graff, "Wave Motion in Elastic Solids", Dover Publications, Inc., NY (1990).

Cohen, "Time-Frequency Analysis", Prentice-Hall, Englewood Cliffs, NJ (1995).

Mallat, "A Wavelet Tour of Signal Processing", Academic, NY (1998).

Rose, "Ultrasonic Waves in Solid Media", Cambridge University Press, New York, NY (1999).

Niethammer et al., "Time-frequency Representations of Lamb Waves", Journal of the Acoustical Society of America, 109(5), pp. 1841-1847 (2001).

Ban, Liang et al. "Acoustic Monitoring of Nonuniformly Eroded PVD Targets". IEEE Transactions on Semiconductor Manufacturing, vol. 19, No. 4 (Nov. 2006) pp. 425-431.

* cited by examiner

SYSTEM AND APPARATUS FOR REAL-TIME MONITORING AND CONTROL OF SPUTTER TARGET EROSION

BACKGROUND OF THE INVENTION

1. Field of the Invention

The present invention relates to a method and apparatus for real-time monitoring and controlling surface area erosion of a sputter target assembly utilized in a physical vapor deposition process. In particular, the invention pertains to a method of accurately monitoring, measuring the thickness variation on the surface of a sputter target for the purpose of controlling the physical vapor deposition process.

2. Description of Related Art

In the formation of integrated circuits, flat panel displays, inkjet print-heads, and data storage devices sputtering targets are material sources utilized in the physical vapor deposition (PVD) processes. Sputter targets are generally made of highly advanced engineered material of high purity (e.g. Ta, Ti, Cu, Al, Au, etc.). The targets are produced via a number of various energy intensive processes, depending on the ultimate application. During the PVD process, the targets are employed to deposit a thin metal film on a particular substrate. Consequently, in a typical PVD process, the target is sputtered by the bombardment of ions generated in a glow discharge plasma and the sputtered particles are condensed on the substrate to material as thin film. The magnetron system provides a high deposition rate and uniformity to the deposited films. The material removed from the target and deposited onto the substrate, creates erosion patterns onto the target due to the uneven distribution of the plasma thereon. The patterns are non-uniform and may lead to unacceptable film formation, less than optimum use of the target, and ultimately catastrophic failing of the target known in the art as "punch-through" of the target. As shown in FIGS. 1(a) and (b), a typical 200 mm sputter target close to its end-of-life phase exhibits visible non-uniform erosion patters.

A number of methods have been proposed over time to monitor the erosion of targets and control the PVD process. One of the methods includes the rudimentary opening of the vacuum chamber to visually inspect the state of the target. Naturally, this manual monitoring practice cannot be employed when the deposition process is occurring, as it causes substantial energy losses as well as lengthy equipment downtime.

More recently, in-situ systems for monitoring have been developed. Mohnke et al (German Democratic Republic Patent Document No. 216,258 A1) discloses a system where the propagation of surface acoustic waves on the target is utilized to measure and control the cathode sputtering process. In particular, two transducers installed on the surface of the cathode sputtering target are employed to propagate and receive the surface acoustic waves. One of the disadvantages related to this system is that the transducers are disposed on the surface of the target, albeit outside the erosion zone, where part of the target material remains unemployed. Another disadvantage is that the resonant frequency of the delay line is temperature dependent. As a result, the surface temperature of the target is a sensitive indicator of the erosion, which in turn is dependent on the large temperature coefficient and resonant frequency. A further disadvantage with the related art systems is that the wave amplitude substantially attenuates and renders the erosion measurement difficult. In addition, the temperature and pressure fields on the surface of the target deleteriously affects the speed of the surface acoustic waves, which in turn reduces the accuracy in predicting travel distances and the state of erosion.

Hori (Japanese Patent Document No. 63[1998]-290,270 A) discloses a method of measuring the target thickness in sputtering system by attaching an ultrasonic oscillator to the back side of the target in the sputtering system, radiating an ultrasonic wave from this ultrasonic oscillator into the target, and detecting the resonance of the target. In another sputtering system, Kishimoto et al (Japanese Patent Document No. 6[1994-41,744]) discloses an ultrasonic transmitter and receiver, as well as a controller for arithmetic processing of the output of the receiver. An arrangement is made to measure the propagation time of an ultrasonic wave that makes a round trip through the target in both the eroded and uneroded region, and the extent of the target erosion has occurred is measured by examining the ratio of the minimum to maximum propagation times with the use of a controller. However, in the latter two systems, the ultrasonic transmitters propagate waves in the thickness direction of the target. Thus, numerous transmitters are necessary to measure discreet points on the target. Another disadvantage is that the operator would have to predetermine the location of the erosion and non-erosion zones via trial and error.

To meet the requirements for in-situ monitoring of PVD targets, it is an object of the present invention to provide a novel method and apparatus for real-time monitoring the surface of the target.

It is another object of this invention to provide an embedded acoustic device for monitoring the target's erosion during the entire film deposition cycle.

It is yet another object of the invention, to employ an ultrasonic device which propagates waves over and throughout the entire target.

It is a further object of the invention, to provide two or more acoustic devices that generate and detect the ultrasonic signals in a sputter target assembly in a non-invasive manner.

Other objects and advantages of the present invention will become apparent to one of ordinary skill in the art upon review of the specification, drawings and claims appended hereto.

SUMMARY OF THE INVENTION

The foregoing objectives are met by the method and apparatus of the present invention. According to a one aspect of the invention, a method for real-time monitoring surface area erosion of a sputter target and controlling the physical vapor deposition process is provided. The method includes providing a sputtering target assembly including a backing plate and a sputter target having a surface area which is sputtered to deposit a thin film onto a substrate; transmitting and propagating ultrasonic waves in multiple modes over substantially the entire surface of the sputter target; receiving the ultrasonic waves and processing the signal received to monitor and determine the depth of erosion at different locations on the sputtering target in real-time; and controlling the physical vapor deposition process by replacing the sputtering target upon reaching a predetermined amount of erosion of the sputter target.

According to another aspect of the invention, an apparatus for real-time monitoring surface area erosion of a sputter target in a physical vapor deposition process is provided. The apparatus includes a sputtering target assembly including a backing plate and a sputter target having a surface area which is sputtered to deposit a thin film onto a substrate; at least one transducer disposed through the back of the backing plate to transmit, propagate and receive ultrasonic waves over substantially the entire surface of the sputter target; a pulser/receiver to provide and receive a voltage from the at least one transducer; an oscillator or a digitizing circuit/device to record the ultrasonic wave signal transmitted and received; and a program logic device to monitor and determine the depth of erosion at different locations on the surface of the sputtering target in real-time during a physical vapor deposition process.

BRIEF DESCRIPTION OF THE DRAWINGS

The objects and advantages of the invention will become apparent from the following detailed description of the preferred embodiments thereof in connection with the accompanying drawings, in which like numbers denote the same features:

FIG. 1(*b*) illustrates a graphical representation of the target shown in FIG. 1(*a*);

DETAILED DESCRIPTION OF THE INVENTION

The invention is based, in part, on the real-time monitoring surface erosion of a sputter target utilized in the PVD process. It will be recognized by those skilled in the art that "real-time" as employed herein means the active or simultaneous monitoring of the surface erosion as the particular process is carried out. The development of a real-time method and apparatus takes data in-situ during the normal operation of the sputtering equipment, and which does not interfere with its normal operation.

Figure 1A:
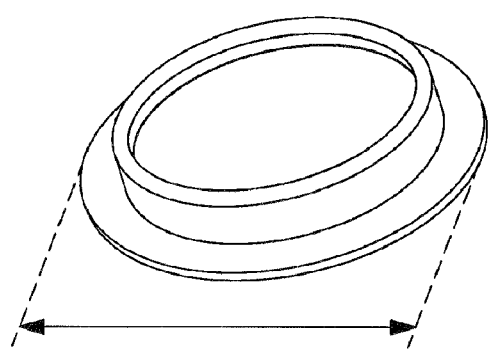
FIG. 1(*a*) illustrates a 200 mm conventional sputter target after the PVD process (i.e., close to the end-of-life phase) with a visible erosion pattern on the surface thereof.
Figure 1B:
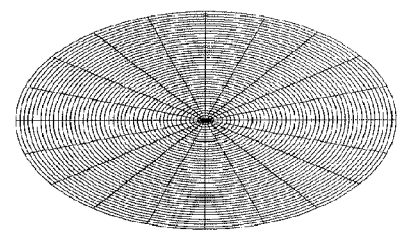
Figure 2:
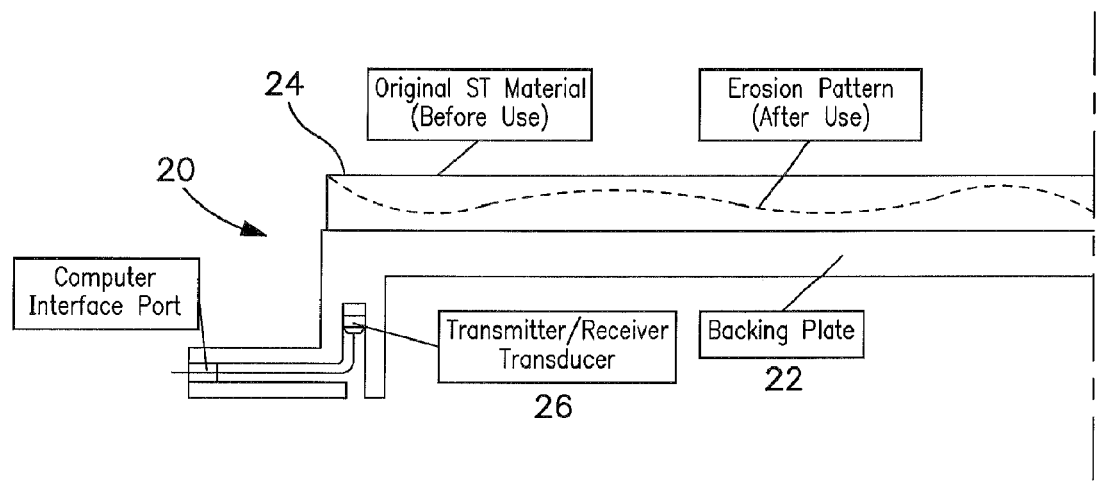
FIG. 2 depicts a schematic cross-sectional representation of an in-situ monitoring system.

As illustrated in FIG. 2, a sputtering target assembly 20 is provided. The assembly includes a backing plate 22 and a sputter target 24 having a surface which is sputtered to deposit a thin layer of film onto a substrate. As shown therein, a pattern of erosion occurs during the PVD process, wherein a plasma is applied to the surface of sputter target 24. In order to monitor the erosion of sputter target 24, an acoustic device 26 is embedded in the backside of backing plate 22. The acoustic device is employed to propagate ultrasound waves through the sputter target and receive same in order to monitor the erosion state of sputter target 24 without interrupting the PVD process. This is a "pulse and echo" arrangement, where the ultrasonic waves are promulgated by acoustic device 26 and received by a similar device at another point (not shown). This device is in turn electrically connected to a pulser-receiver, an oscilloscope (or a digitizing circuit) and to a computer such as a programmable logic controller (not shown) which analyzes and interprets the data received and determines the depth of erosion at various locales on the surface of sputter target 24. Hence, the operator has the ability to monitor the remaining life of the sputter target 26.

Figure 3:
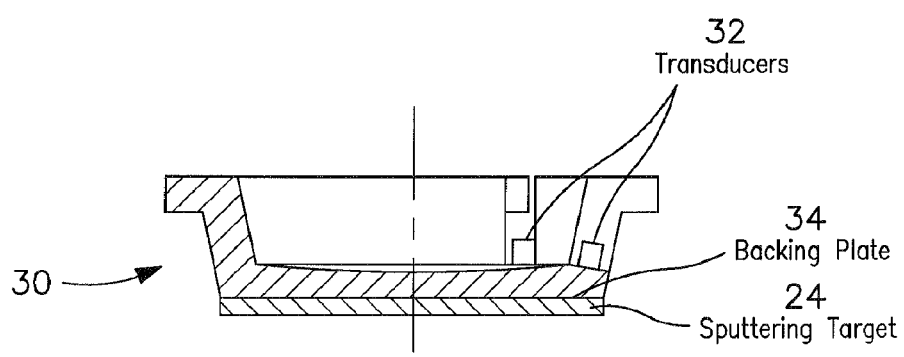
FIG. 3 represent a schematic sputter target assembly with the transducers inserted in the backing plate.
Figure 4:
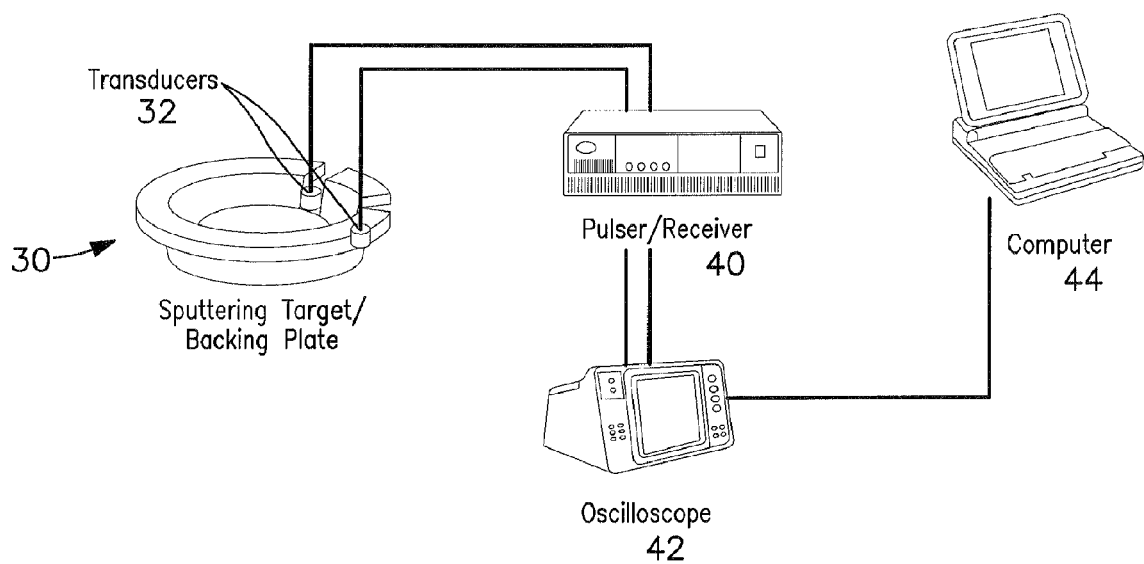
FIG. 4 illustrates the real-time monitoring system including the pulser/receiver, the oscilloscope (or a digitizing circuit/device) and controller.

In accordance with another embodiment of the present invention, and as illustrated in FIG. 3, two acoustic devices 32 are embedded through the backside of backing plate 34 of sputter target assembly 30. The acoustic devices can be piezoelectric elements such as the 2.25 MHz transducers manufactured by KB Aerotech. The transducers are disposed on the periphery of the sputter target in a "pitch and catch" arrangement, where the ultrasonic waves are generated by one of the transducers and received by the other. Preferably, the transducers are disposed on the perimeter of backing plate 34 at an angle ranging from about 0 to 180 degrees and preferably set at about 67.5 degrees apart. As depicted in FIG. 4, a pulser/receiver 40 is employed to deliver a transient voltage to the acoustic devices/transducers 32. The pulser/receiver can be a 5077PR instrument provided by Panametrics and which generates and delivers at least 100 volts. A stress field propagates through target assembly 30, and the waves propagated are received by one of the acoustic devices 32 which converts same to a transient voltage waveform. The voltage waveform is transmitted to the pulser/receiver 40, which in turn transmits the voltage to an oscilloscope (or a digitizing circuit) 42 utilized to display the waveform of the electronic signal. The oscilloscope (or a digitizing circuit) utilized can be a TDS3052 500 kMHz instrument made by Tektronix. The distribution of acoustic natural frequencies is sent to a program logic device or computer which is employed to determine the depth of erosion at different locations on the target in real-time.

Figure 5:
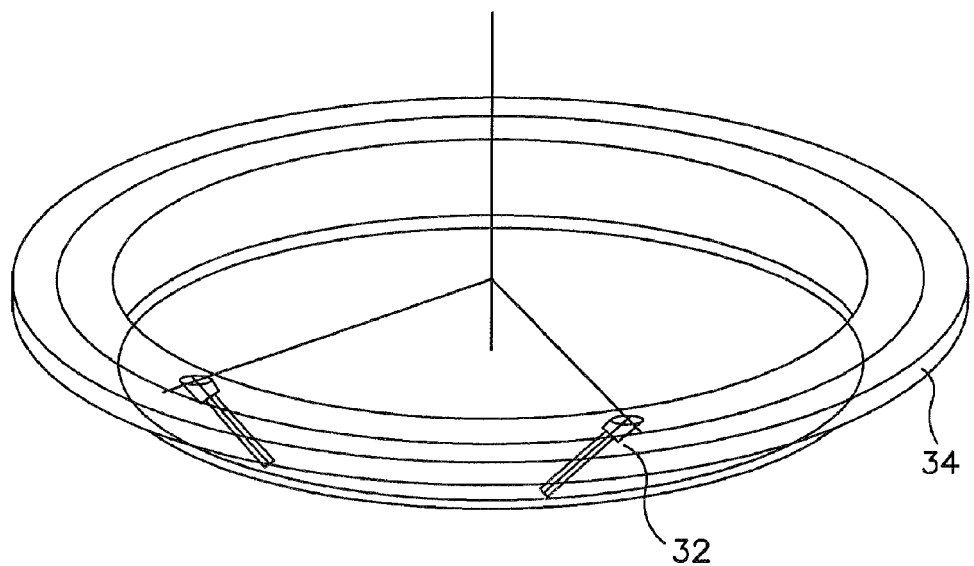
FIG. 5 illustrates a target assembly having the acoustic devices inserted into the backing plate at an angle ranging from 5-45 degrees in relation to a perpendicular to the plane of the target plate.

In a further embodiment, and as shown in FIG. 5, the backing plate 34 is bored at an angle ranging from 5 to 45 degrees in relation to a perpendicular to the plane of the target plate. The acoustic devices are placed therein in a number of locations. The signal transmission is enhanced as the noise level associated with the propagating waves is reduced by about 3-50%. Naturally, a number of acoustic devices 32 can be employed in the process.

The acoustic monitoring technique combined with the signal processing techniques can be utilized for monitoring of non-uniformly shaped erosion patterns of the sputter targets during the PVD process. Consequently, the life expectancy predictions of the sputtering targets can be made in an uninterrupted manner.

The process is carried out to acquire the transient responses of the sputter target excited by the embedded piezoelectric transducer. Various signal processing techniques are applied to the waveforms to determine the erosion state of the particular target. The signal processing methodologies employed in the analysis includes (i) time-frequency analysis based dispersion curves development of multimode guide wave (also referred to as reassigned spectrogram); (ii) cross-correlation based index extraction (also referred to as the time-domain analysis); and (iii) cross-spectral density estimation (also referred to as the frequency-domain signal processing). This acoustic monitoring system is incorporated into the PVD process for real-time monitoring of the end-of-life detection of a sputtering target assembly without the interruption of the PVD cycle.

The pulser/receiver 40 generates and detects guided plate waves in the bonded sputtering target. Waveforms are acquired and processed for identifying erosion levels. The dispersion curves of the backing plate and the sputter target assembly are developed by utilizing the time-frequency analysis. Comparisons of the dispersion curves of the bonded sputtering target in different erosion levels are made, and the cross-correlation technique in the time domain is applied to identify the severity level of the erosion patterns. Spectral-density estimation of cross-relation is calculated as well.

The acoustic monitoring and signal processing techniques utilized for real-time monitoring of the sputter target and control over the PVD process will be further described in detail with reference to the following example, which is, however, not to be construed as limiting the invention.

EXAMPLE

The instruments were set up as shown in FIG. 4. The pulser/receiver 34 generated and delivered 100 volts square pulse to the transmitting acoustic device 32, at a central frequency of 500 kHz, and provided a synchronizing pulse to trigger the digital oscilloscope 42. The propagating acoustic field excited by the transmitting acoustic device 32 interacted with the surface variation of the bonded sputtering target resulting in the guided waves with certain dispersion properties. The guided waves propagating along the bonded sputtering target were acquired by the receiving acoustic device 32. The acquired signal was saved as a digital waveform by the oscilloscope and transmitted to computer 44 for signal processing.

With reference to FIG. 2, the bonded sputtering target assembly included a backing plate 22 manufactured from a copper material, a sputter target 24 of tungsten/titanium and a thin bonding layer (e.g., solder) therebetween. The thickness of the backing plate was 6.80 mm, with a sputter target plate of 6.60 mm, and the solder bond in between having a thickness of 0.51 mm.

Figure 6:
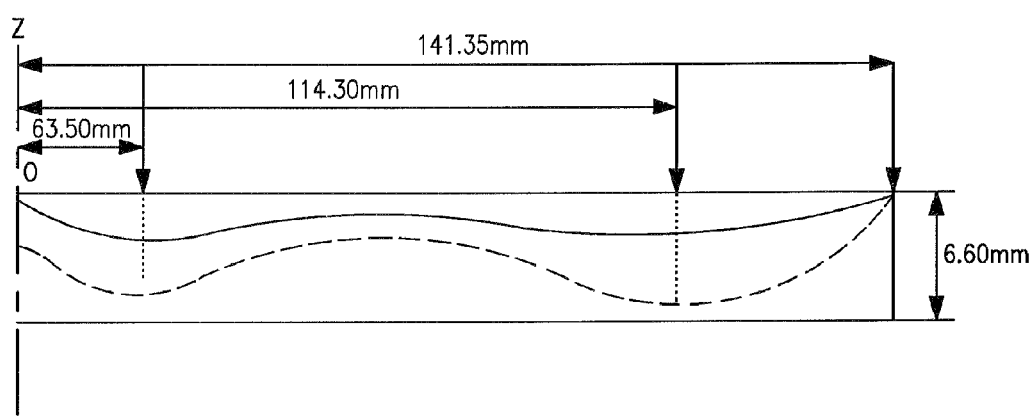
FIG. 6 depicts the erosion profile of a sputter target.
Figure 7A:
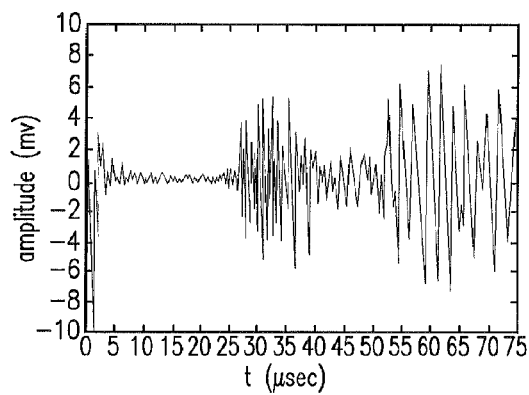
FIG. 7 represent the acquired waveforms in (a) backing plate only; (b) fresh plate, (c) lightly eroded plate (33.33% of the nominal life); and (d) deeply eroded plate (130.48% of the nominal life)
Figure 7C:
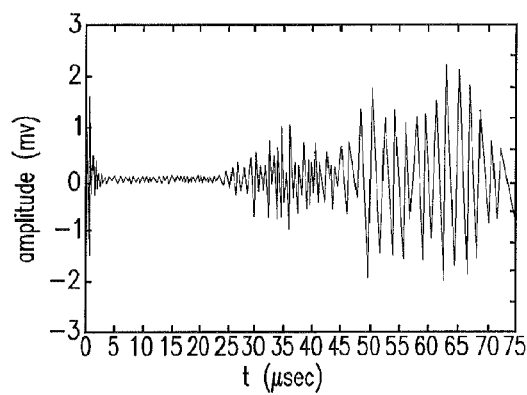
Figure 7B:
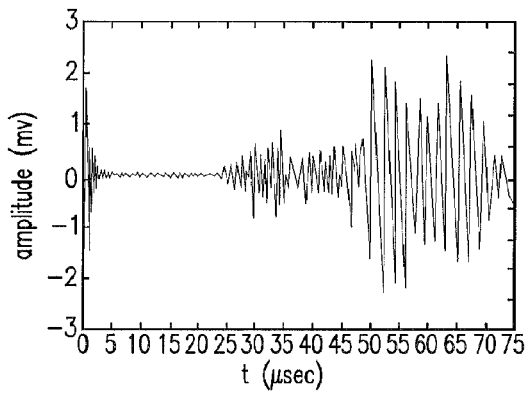
Figure 7D:
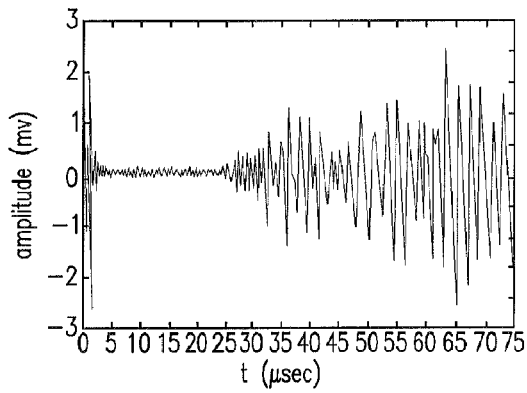

During the deposition process, the sputtering target tends to erode the fastest in the areas where the plasma interacts with the target as a result of the magnetic field applied on the underside of the backing plate, creating grooves on the surface of the sputtering target. Three different erosion grooves, named here as inner, outer and central erosion zones, were identified. The erosion profile is shown in FIG. 6. The distances from inner erosion and outer erosion zones to the center of the sputtering target was 63.50 mm and 114.30 mm, respectively. The central erosion zone was the shallowest erosion area compared to the inner and outer erosion zones throughout the sputtering process. The sputter target eroded most rapidly at the outer erosion zone due to the strongest magnetron effects. When the depth of the outer erosion approaches the sputter target thickness save a certain margin for safety purposes, the sputter target is replaced with a fresh one. Thus, the increment in the depth of the outer erosion groove is of importance in predicting the end of life of the sputtering target.

The nominal life of a sputtering target defined by manufacturing is not the actual life of the target but the conventional empirical value for reliable sputtering. The nominal life of the tested tungsten/titanium target for reliable sputtering was 214 kW-hrs. The actual life of the target observed in acoustic monitoring in-situ was 277 kW-hrs. Thus, the actual life of the target was 63 kW-hrs longer than that of the nominal life, that is, there is extra 33% thickness of the target material could be utilized.

During real-time monitoring, the guided acoustic waves launched by the transmitting acoustic device in the bonded sputtering target were acquired at the receiving acoustic device, as the sputtering process proceeded. The critical thickness variance of the three erosion grooves under the different erosion levels was recorded. Totally twenty-nine sets of waveforms corresponding to the sputtering target with various erosion levels were acquired throughout the in-situ testing. The three typical cases of waveforms for the bonded sputtering target specified as fresh plate, light eroded plate (33.33% of the nominal life) and deep eroded plate (130.48% of the nominal life) were tabulated are shown in the Table below.

TABLE

| Erosion State | Actual life | Thickness Measurement | | |
|---|---|---|---|---|
| | | $\Delta h_{in}$ | $\Delta h_{out}$ | $\Delta h_{center}$ |
| W01 | 0.00 Kw-hours (0%) | 0.000 mm | 0.000 mm | 0.000 mm |
| W02 | 70.00 KW-hours (33.33%) | 0.830 mm (13.07%) | 1.473 mm (23.20%) | 0.000 mm (0%) |
| W03 | 138.00 KW-hours (65.71%) | 1.778 mm (28.00%) | 3.302 mm (52.00%) | 2.057 mm (39.48%) |
| W04 | 195.63 kW-hours (93.16%) | 2.489 mm (39.20%) | 4.622 mm (72.79%) | 2.895 mm (45.59%) |
| W05 | 213.59 kW-hours (101.71%) | N/A | N/A | N/A |
| W06 | 255.87 kW-hours (121.84%) | 3.149 mm (49.59%) | 6.096 mm (96.00%) | 3.657 mm (57.59%) |
| W07 | 274.01 kW-hours (130.48%) | N/A | N/A | N/A |

The transient waveforms acquired in (a) backing plate only (b) fresh or target plate (c) light eroded plate (33.33% of the nominal life) and (d) deep eroded plate (130.48% of the nominal life) with the same propagation distance, d=109 mm, are depicted in FIG. 7. These waveforms are sampled at 250 MHz and averaged 512 times to obtain high signal-to-noise ratio (SNR). It is observed that the four transient waveforms have similar arrival times, which was approximately 24 μs from the transmitting port to the receiving port. However, the amplitude levels in the case of backing plate are much higher than those in fresh and eroded bonded sputtering targets within the same wave portion. While not wanting to be bound by any particular theory, it is believed that this phenomenon is due to the leakage of strain energy into the bonded layers in this target assembly as compared to the propagation in the backing plate only. Further signal processing was required to extract the features identifying the state of erosion levels out of the transient waveforms.

The three signal processing methods include the aforementioned (i) time-frequency analysis based dispersion curves development of multimode guide wave; (ii) cross-correlation based index extraction; and (iii) cross-spectral density estimation.

Method 1. The Time-Frequency Analysis

Many modes of elastic waves propagate in a waveguide, and each wave mode has a unique velocity-frequency relationship known as dispersion relation. Elastic moduli, material density and geometric dimensions of a waveguide govern the dispersion relations of the guided waves. A multilayered system made up of platelike waveguides also has the dispersion feature, and the corresponding dispersion curves depend on the material properties and thickness of each layer. When the presence of flaws (e.g., erosions or cracks) appears on the surface or inside of the waveguide structure, the dispersion curves displays the corresponding changes as the form of modes shifting or conversion. Signal processing methods (e.g. time-frequency analysis, etc.) were utilized to determine the dispersion relations of a structure.

Ultrasonic waves are non-stationary signals of frequency and amplitude varying with time. These signals can be represented by a three-dimensional surface of energy distribution as a function of time and frequency in time-frequency domain. The projection of the surface into time-frequency domain is called time-frequency representations (TFRs) of a signal. A specific TFR, reassigned spectrogram, was employed on the acquired waveforms. The reassigned spectrogram technique based on the Modified Moving Window Method (MMWM) was viewed as a refinement of Short-Time Fourier Transform (STFT) which is defined as:

$$S_h(t, f) = \int_{-\infty}^{+\infty} x(\tau) h^*(\tau - t) e^{-j2\pi f \tau} d\tau \quad (1)$$

where h(t) is a window function. STFT spectrogram (i.e., energy distribution of a signal) is the squared modulus of the windowed Fourier transform and plotted in time-frequency domain. However, the STFT cannot localize very precisely the energy distribution of a signal in time-frequency domain. The trade-off relationship between the time and frequency resolutions was improved by utilizing the reassignment technique. In reassignment theory, the spectrogram or energy distribution is moved away from its original coordinates (t,f) to the reassigned locations of new coordinates where energy spreading has been reduced greatly. As a result, improved visualization was obtained with sharp temporal and spectral resolutions provided. The reassigned new coordinates $\hat{t}$ and $\hat{f}$ for a spectrogram were defined as:

$$\hat{t} = t - \mathcal{R}\left(\frac{S_{Th}(x, t, f) \cdot \overline{S_h(x, t, f)}}{|S_h(x, t, f)|^2}\right) \quad (2)$$

$$\hat{f} = f - \mathcal{J}\left(\frac{S_{Dh}(x, t, f) \cdot \overline{S_h(x, t, f)}}{|S_h(x, t, f)|^2}\right) \quad (3)$$

where $S_h(x,t,f)$ is the STFT definition of signal x using window function h(t); $S_{Th}(x,t,f)$ and $S_{Dh}(x,t,f)$ are the STFTs with t·h(t) and $$\frac{dh(t)}{dt}$$

as their window functions; respectively. The reassignment spectrogram was implemented in a commercially available MATLAB program.

Figure 8A:
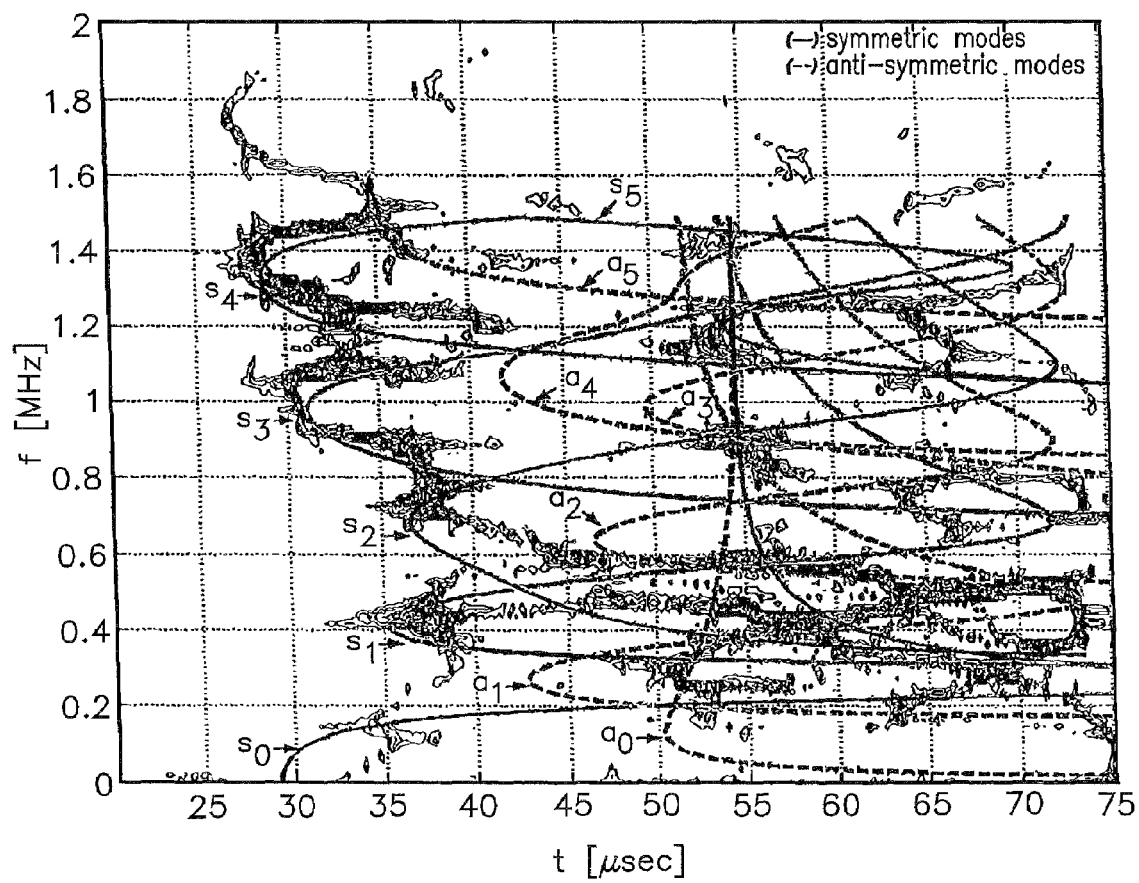
FIG. 8 illustrates the reassigned spectrogram of the waveform in (a) backing plate only; (b) fresh plate, (c) lightly eroded plate (33.33% of the nominal life); and (d) deeply eroded plate (130.48% of the nominal life) with analytical curves superimposed.

The reassigned spectrogram technique was employed on the acquired transient waveforms of the backing plate and the bonded sputtering target under various erosion levels to determine the corresponding dispersion relations. The reassigned spectrogram of the backing plate superimposed with the analytical dispersion curves of a 6.80 mm-thick copper plate is depicted in FIG. 8(a). The analytical dispersion curves are plotted as solid (symmetric mode) and dashed (anti-symmetric mode) lines. A software package (AGU-Vallen Dispersion Curves) was utilized to calculate the analytical dispersion curves of the 6.80 mm-thick copper plate. It was observed that the reassignment spectrogram provided concurrence and an easy visual mode interpolation between the analytical and experimental dispersion curves of the backing plate within certain areas. Prior to 40 µs, it is shown that the experimental procedure provides a good match at the first arrival sections (25 µs - 40 µs time interval) of the symmetric modes $S_3$, $S_4$ in high frequency range of 1 MHz-1.4 MHz and the symmetric modes $S_1$, $S_2$ in middle frequency range of 0.4 MHz-0.8 MHz.

Within the same time range, symmetric mode $S_0$ in the low frequency range of 0 MHz-0.2 MHz has less curve matching compared to the other symmetric modes due to low energy density at this mode. Beyond 45 µs, it is difficult to identify the individual modes since the symmetric modes and anti-symmetric modes are closely spaced and overlap. Additionally, the reflections from the boundaries of the backing plate begin interacting and mixing with the reflection-free wave fronts.

Figure 8B:
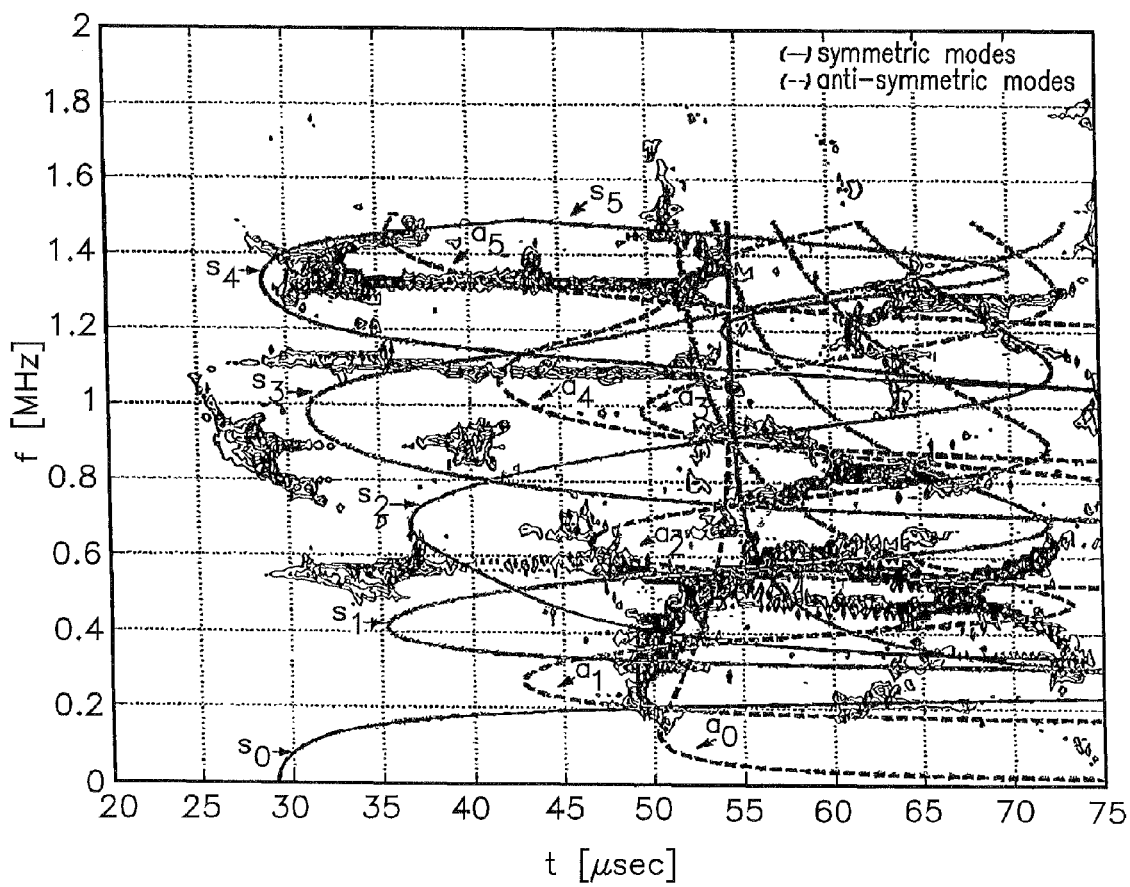

FIG. 8(b) displays the reassigned spectrogram in the case of the fresh plate superimposed with the analytical dispersion curves of a 6.80 mm-thick copper plate. Since the boundary conditions and waveguide material changed, the current dispersion curves only slightly resemble the analytically developed dispersion curves of the copper plate. Prior to 40 µs, the first arrival wave packets no longer match the curved sections of the analytical dispersion curves. For example, modes both in the high frequency range of 1.6 MHz-1.8 MHz and in the low frequency range of 0.2 MHz-0.4 MHz are missing. In addition, modes at 0.6 MHz and in the frequency range of 0.8 MHz-1.2 MHz are translated forward. It is believed that the transmission velocity in tungsten/titanium is much faster than that in copper, and these modes, which are more sensitive to the changes of material properties during the guided waves propagation, would rather travel through the tungsten/titanium layer than the copper layer. Therefore, these sensitive modes move forward or arrive early at particular frequency ranges.

Figure 8C:
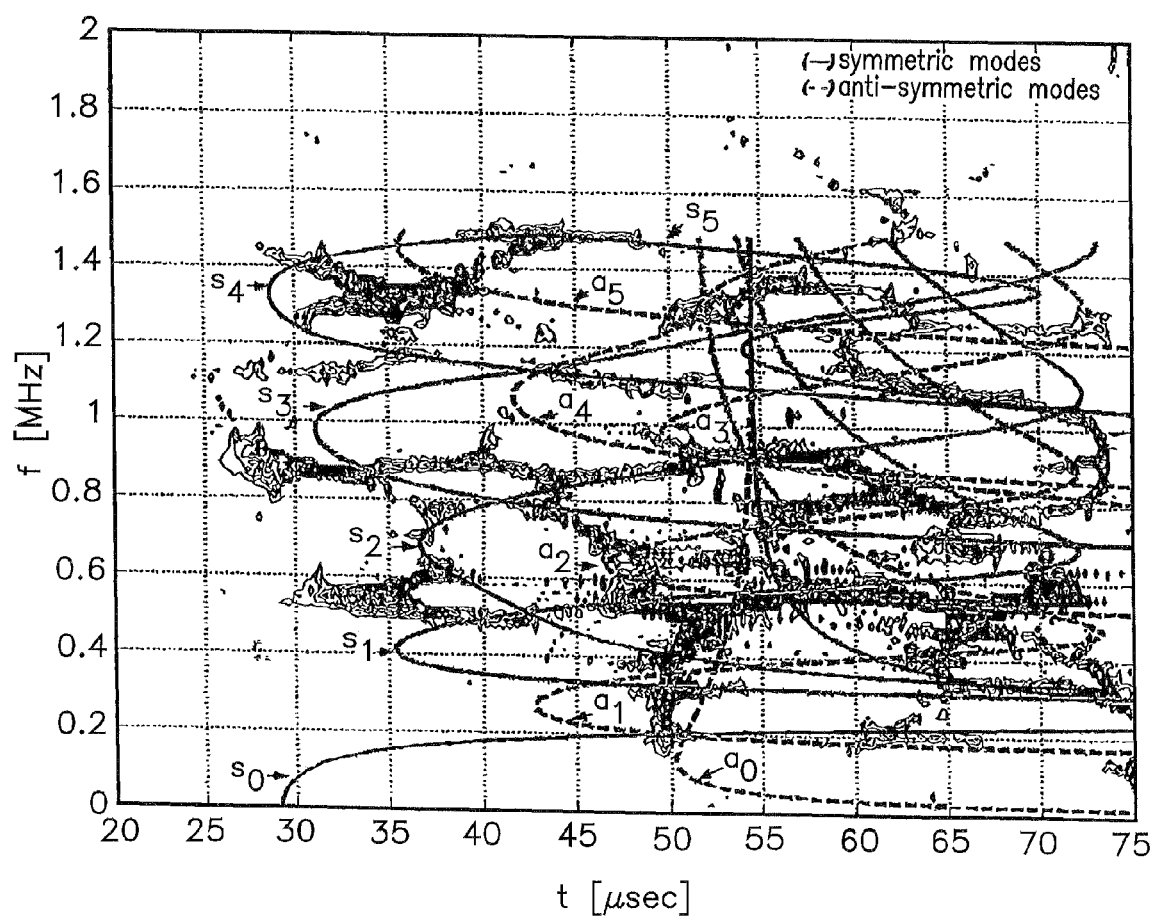
Figure 8D:
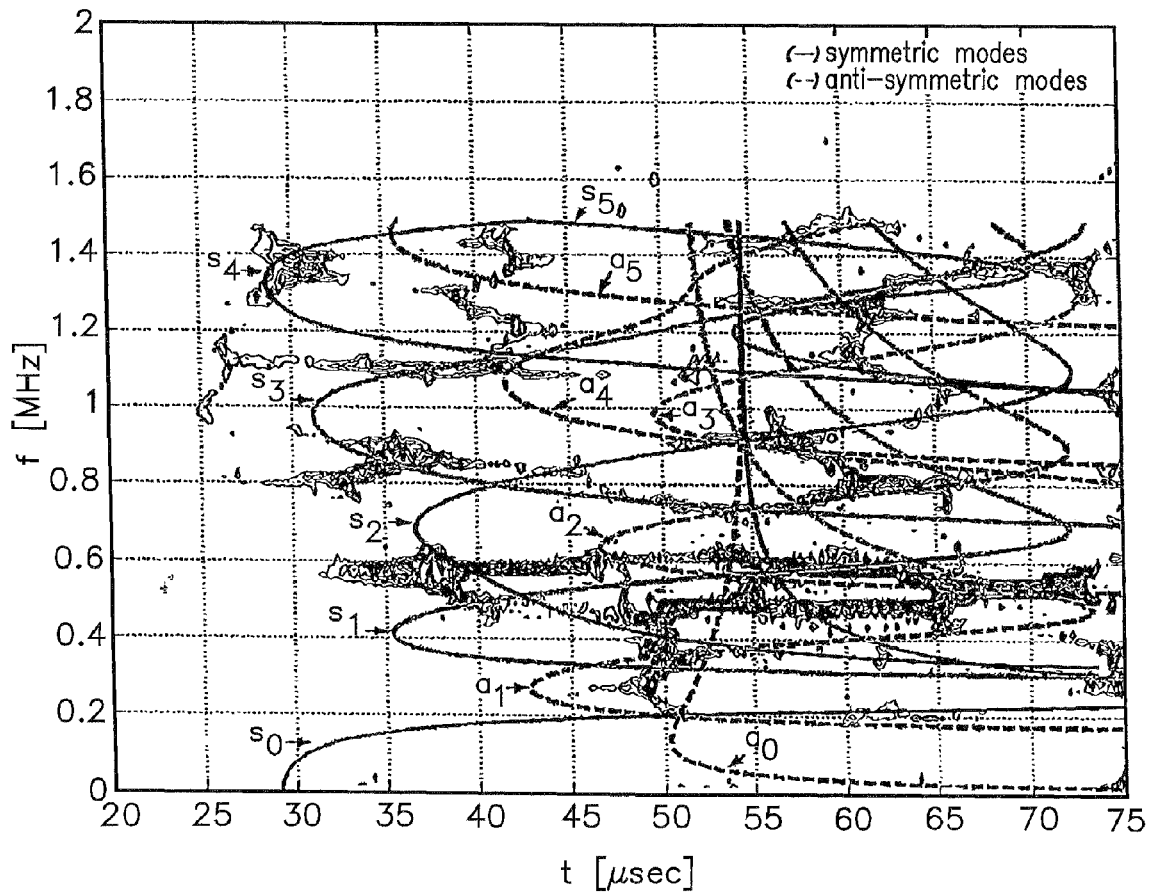

FIG. 8(c) depicts the reassigned spectrogram of the light eroded plate with 33% nominal life consumed. It was observed that the front edges of these sensitive modes are shifted backward compared to those with no erosion. For example, prior to 40 µs, the forwarded modes in the frequency range of 0.8 MHz -1.4 MHz are translated backward by a few microseconds. When erosion deepens to 130% of the nominal life, most of the forwarded modes disappeared as shown in FIG. 8(d), since the preferred propagation path for these sensitive modes in tungsten/titanium layer becomes thinner and narrower, as well as additional tungsten/titanium material is consumed. As a result, some sensitive modes in dispersion curves move backward continuously until they disappear as erosion spreads wide and deep. By visualization, a consistent change of mode shifting interpreted by reassigned spectrogram in time-frequency domain is obtained and thereafter the state of erosion levels and the actual life of the sputtering target can be effectively monitored (see FIGS. 8(b)-(d)).

Method 2. Cross-correlation Based Index Extraction

The progress of erosion patterns on the sputtering target continuously affects dispersion properties of the guided waves, which consequently results in the variance of wave shapes. The degree of wave shapes variance increases as more tungsten/titanium material is consumed. The similarity of the acquired waveforms can be used as a signature to identify the erosion levels. Cross-correlation technique was chosen to accomplish the extraction of the similarity features identifying the states of erosion levels since this technique can be used as a similarity measure between two correlated signals. Cross-correlation technique employed on the experimental waveforms is defined as:

$$R_{xy}(m) = \sum_{n=-\infty}^{\infty} x(n)y(n+m) \quad (4)$$

where x(n) represents the transient waveform acquired for the fresh plate (reference waveform) and y(n) represents the transient waveforms for the bonded sputtering target with erosion levels. $R_{xy}(m)$ is the cross-correlation sequence between x(n) and y(n) at the moment of m with x(n) fixed and y(n) shifted left with m steps. The normalized value of $R_{xy}(m)$ at zeroth time shifting indicates the degree of similarity between x(n) and y(n). It is expected to see the degree of similarity decrease as the erosion depth approaches the thickness of the sputtering target. In other words, the waveforms in deep eroded conditions are less similar to the reference waveform than the ones in light eroded conditions.

Figure 9:
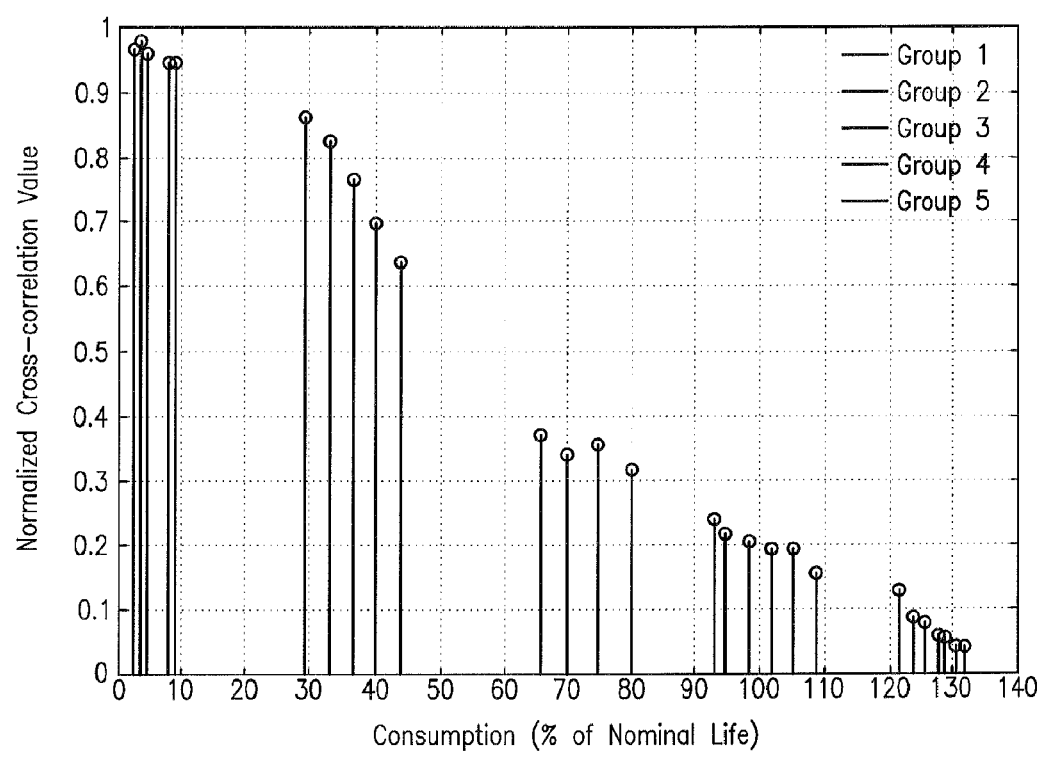
FIG. 9 is a graphical representation of normalized cross-correlation values vs. the consumption throughout the PVD process.

The overall twenty-nine sets of acquired waveforms were organized into five groups as the ascending order of actual life for the cross-correlation analysis. The results of applying this method to the five groups of waveforms is summarized in FIG. 9. Without erosion, the normalized cross-correlation at zeroth time shifting is the result of auto-correlation of the reference waveform itself, which is one. After erosion patterns appear, the normalized value of cross-correlation at zeroth time shifting decreases as further erosion proceeds. It was determined that light erosion groups have higher normalized cross-correlation values compared to deep erosion groups. The averaged normalized cross-correlation values of group 2 (light erosions with 30%-45% of the nominal life) are around 75% of the no-erosion case; whereas in group 5 (deep erosions with 120%-130% of the nominal life), the averaged values drop roughly to 7% of that in no erosion case.

It is demonstrated that the averaged normalized value of cross-correlation at zeroth time shifting exhibited a clear monotonous decreasing trend as more life of the sputtering target consumed. Thus, a quantitative index is obtained for identifying the erosion levels and actual life of the sputtering target through the analysis of cross-correlation technique on the experimental waveforms. It was noted that the values of normalized cross-correlation may disorder the decreasing trend within groups (see groups 1 and 3 in FIG. 9), but they do change the major monotonous trend throughout the sputtering process.

Method 3. Cross-Spectral Density Estimation

Spectral density estimation is commonly used in the calculation of the power spectra density of signals. The basic algorithm of cross-spectral density (CSD) estimation implemented with MATLAB program is:

Step 1. Apply a window function specified by a window vector to each successive detrended data section x and y.

Step 2. Take FFT transform on each data section with the number of n point.

Step 3. Form the periodogram of each section by scaling the product of the transformed y section and the conjugate of the transformed x section.

Step 4. Average the periodograms of the successive overlapping sections to form $P_{xy}$, the cross-spectral density of x and y sections.

Figure 10:
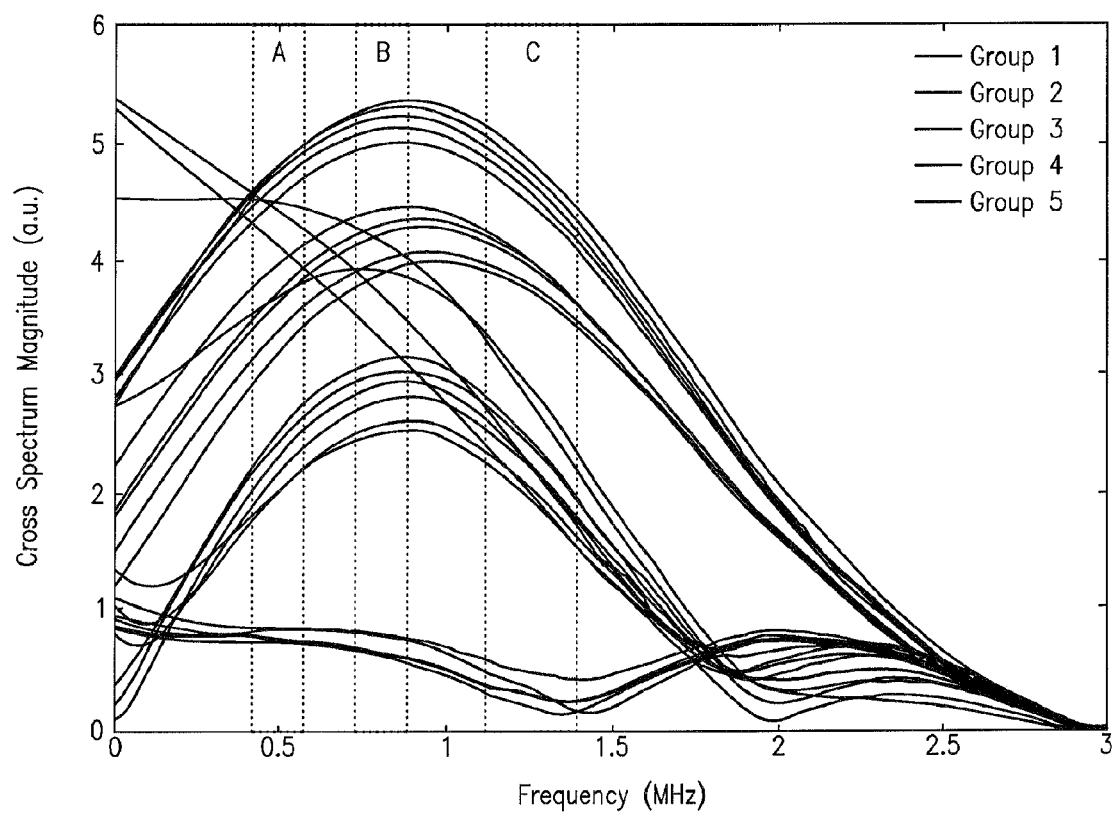
FIG. 10 illustrates the cross-spectral density estimation of the acquired waveforms.

The cross-correlation technique provides a good quantitative identification in monitoring the erosion levels and actual life of the sputtering target in time domain; thereafter the corresponding spectral density estimation of the cross-correlation in frequency domain is expected to show the similar decreasing order as erosion levels increase. Similar to the cross-correlation, section x represents the transient waveform acquired for the fresh plate (reference waveform); and section y represents the transient waveforms for the bonded sputtering target with various erosion levels. The cross-spectral density (CSD) estimation was implemented on the five groups of acquired waveforms. The CSD results are shown in FIG. 10. Rectangular areas of A, B and C are corresponding to the excited frequency band by means of the transducers on the bonded sputtering target. Within area A (0.4 MHz-0.6 MHz), it is observed that the CSD estimation of the five groups has no clear order at all; in area B (0.8 MHz-0.9 MHz), the CSD estimation depicts a good order except the small mix-up occurred between group 2 and group 3; in area C (1.2 MHz-1.4 MHz). The expected decreasing order is shown as more target consumed throughout the deposition process. Note that the CSD estimation exhibits a clear order corresponding to the erosion levels in high frequency range rather than in low frequency range; in other words, high frequency area (1 MHz-1.4 MHz) is more sensitive to the thickness variation of the sputtering target. One possible explanation for this phenomenon is that the shallow erosion groove, which is more like a trivial dent or notch, tends to interact with short compatible wavelength, which is equivalent to high frequency mode. In addition, as erosion increases, long compatible wavelength or low frequency modes will take place to interact predominantly with deep erosions. As a result, high frequency modes diminish the dominant interactions with the erosions in the process of metal sputtering, and record the complete process of erosion.

The results demonstrate that the acoustic monitoring technique combined with signal processing methodologies can be utilized for monitoring of non-uniformly shaped erosion patterns on the sputtering targets during the PVD process. Consequently, the automatic life expectancy predictions of the sputtering targets can be made in the manner of uninterrupted state, which minimizes manufacturing downtime and energy waste compared to the traditional manual monitoring approach.

The three signal processing methods employed on the acquired waveforms to extract the features identifying the state of erosion levels and actual life of the sputtering target. The time-frequency analysis of reassigned spectrogram (Method 1) interprets closely spaced multimode guided waves in the backing plate, and allows for the determination of the dispersion relations of the bonded sputtering target with various erosion levels. As erosion patterns deepen, it is illustrated that the time-frequency analysis can be effectively employed to visually localize the changes of different sensitive modes within certain ranges. These changes involved in the first arrival wave portions of these sensitive modes display a consistent trend in the increasing order of erosion levels. The cross-correlation technique (Method 2) provides a quantitative index to detect the evolution of the erosion progress by extracting the normalized cross-correlation value at zeroth time shifting between the fresh and the eroded sputtering target. In addition, cross-spectral density estimation (Method 3) displays a clear order indicating the decreasing cross-spectral density along the exaggeration of the erosion patterns within the frequency range of 1 MHz-1.4 MHz. The results of time-frequency analysis and CSD estimation all indicate a clear trend of the evolutions of the erosion patterns and the actual life of the sputtering target in the frequency range of 1 MHz-1.4 MHz, which is higher than the excitation frequency of the embedded transducers (500 kHz); thereafter, a pair of broadband transducers with the central frequency located within the frequency range of 1 MHz-1.4 MHz can be possibly tested on the bonded sputtering target in order to obtain the results of a clear trend.

While the invention has been described in detail with reference to specific embodiments thereof, it will become apparent to one skilled in the art that various changes and modifications can be made, and equivalents employed, without departing from the scope of the appended claims.

What is claimed is:

1. A method for real-time monitoring surface area erosion of a sputter target and controlling the physical vapor deposition process, comprising:
   providing a sputtering target assembly including a backing plate and a sputter target having a surface area which is sputtered to deposit a thin film onto a substrate;
   transmitting and propagating ultrasonic waves in multiple modes over substantially the entire surface of said sputter target;
   receiving said ultrasonic waves and processing the signal received to monitor and determine by a signal processing methodology selected from the group consisting of time-domain analysis and frequency domain signal processing the depth of erosion at different locations on said sputtering target in real-time; and
   controlling the physical vapor deposition process by replacing the sputtering target upon reaching a predetermined amount of erosion of said sputter target.

2. The method for monitoring set forth in claim 1, wherein a pulser/receiver is utilized to generate and receive the ultrasonic waves.

3. The method for monitoring set forth in claim 1, wherein a single transducer is employed in dual mode to transmit and receive the signal.

4. The method for monitoring set forth in claim 3, wherein said transducer is a piezoelectric element.

5. The method for monitoring set forth in claim 1, wherein at least two transducers are employed, where one transducer transmits and propagates the ultrasonic waves and the other transducer receives the ultrasonic waves.

6. The method for monitoring set forth in claim 5, wherein said transducers are piezoelectric elements.

7. An apparatus for real-time monitoring surface area erosion of a sputter target in a physical vapor deposition process, comprising:
   a sputtering target assembly including a backing plate and a sputter target having a surface area which is sputtered to deposit a thin film onto a substrate;
   at least one transducer disposed through the back of the backing plate to transmit, propagate and receive ultrasonic waves over substantially the entire surface of said sputter target;
   a pulser/receiver to provide and receive a voltage from the at least one transducer;
   an oscillator to record the ultrasonic wave signal transmitted and received; and
   a program logic device to monitor and determine by a signal processing methodology selected from the group consisting of time-domain analysis and frequency domain the depth of erosion at different locations on the surface of the sputtering target in real-time during a physical vapor deposition process.

8. The apparatus for monitoring set forth in claim 7, wherein the at least one transducer is a dual mode piezoelectric element.

9. The apparatus for monitoring set forth in claim 7, further comprising:
   two transducers disposed at different locations on the periphery of the backing plate wherein a first transducer pitches an ultrasonic wave signal and a second transducer receives the signal.

10. The apparatus for monitoring set forth in claim 9, wherein the piezoelectric elements are disposed about 67.5 degrees apart on the periphery of the backing plate.

11. The apparatus for monitoring set forth in claim 9, wherein each of said two transducers is disposed at an angle within said backing plate to enhance signal transmission and reduce noise level.

12. The apparatus for monitoring set forth in claim 11, wherein the noise level is reduced from about 3% to 50% of the signal strength.

13. The apparatus for monitoring set forth in claim 7, wherein the program logic device determines the depth of erosion and sounds an alarm when a predetermined amount of erosion has been reached during operation.

* * * * *